United States Patent
Yoneya

(10) Patent No.: US 10,892,774 B2
(45) Date of Patent: Jan. 12, 2021

(54) RE-QUANTIZATION DEVICE HAVING NOISE SHAPING FUNCTION, SIGNAL COMPRESSION DEVICE HAVING NOISE SHAPING FUNCTION, AND SIGNAL TRANSMISSION DEVICE HAVING NOISE SHAPING FUNCTION

(71) Applicant: Nagoya Institute of Technology

(72) Inventor: Akihiko Yoneya, Aichi (JP)

(73) Assignee: NAGOYA INSTITUTE OF TECHNOLOGY, Aichi (JP)

( * ) Notice: Subject to any disclaimer, the term of this patent is extended or adjusted under 35 U.S.C. 154(b) by 0 days.

(21) Appl. No.: 16/651,508

(22) PCT Filed: Sep. 26, 2018

(86) PCT No.: PCT/JP2018/035643
§ 371 (c)(1),
(2) Date: Mar. 27, 2020

(87) PCT Pub. No.: WO2019/065716
PCT Pub. Date: Apr. 4, 2019

(65) Prior Publication Data
US 2020/0266828 A1   Aug. 20, 2020

(30) Foreign Application Priority Data

Sep. 29, 2017 (JP) ................................. 2017-191237
May 14, 2018 (JP) ................................. 2018-093145

(51) Int. Cl.
*H03M 3/00* (2006.01)
*H03M 7/36* (2006.01)

(52) U.S. Cl.
CPC ................................. *H03M 7/3026* (2013.01)

(58) Field of Classification Search
CPC .... H03M 7/3026; H03M 7/3022; H03M 3/30; H03M 3/50
(Continued)

(56) References Cited

U.S. PATENT DOCUMENTS 5,392,042 A * 2/1995 Pellon ................... H03M 3/404
333/166
6,842,129 B1 * 1/2005 Robinson .............. H03M 3/428
341/143
(Continued)

FOREIGN PATENT DOCUMENTS

JP      07-015281 A      1/1995
JP      2016-213683 A    12/2016

OTHER PUBLICATIONS

International Search Report from PCT/JP2018/035643, dated Dec. 11, 2018.

*Primary Examiner* — Jean B Jeanglaude
(74) *Attorney, Agent, or Firm* — Thomas | Horstemeyer, LLP

(57) ABSTRACT

What is provided is a subtractor, as a re-quantization device, which is configured to detect re-quantization noise, a discrete time filter which is configured to perform frequency weighting on the detected re-quantization noise, an adder which is configured to add an additional signal to quantization noise, and an additional signal selector which is configured to select a value at the present time of a column of an additional signal for minimizing the magnitude of quantization noise having been subjected to frequency weighting evaluated one sampling or more later.

14 Claims, 6 Drawing Sheets

(58) Field of Classification Search
USPC .......................................................... 341/143
See application file for complete search history.

(56) References Cited

U.S. PATENT DOCUMENTS

| | | | | |
|---|---|---|---|---|
| 7,183,957 | B1* | 2/2007 | Melanson | ............... H03F 3/217 |
| | | | | 341/143 |
| 8,299,947 | B2* | 10/2012 | Pagnanelli | ............ H03M 3/468 |
| | | | | 341/143 |
| 8,633,842 | B2* | 1/2014 | Azadet | ................ H03M 7/3042 |
| | | | | 341/143 |
| 9,209,829 | B2* | 12/2015 | Pagnanelli | ............ H03M 3/468 |
| 9,680,497 | B2* | 6/2017 | Pagnanelli | ................ H03F 1/08 |
| 9,735,800 | B2* | 8/2017 | Pagnanelli | .............. H03M 3/51 |
| 2004/0130471 | A1* | 7/2004 | Lee | ......................... H03M 3/46 |
| | | | | 341/143 |
| 2004/0196169 | A1* | 10/2004 | Zierhofer | ................ H03M 3/49 |
| | | | | 341/143 |
| 2008/0165043 | A1* | 7/2008 | Wiesbauer | ............ H03M 3/484 |
| | | | | 341/143 |
| 2011/0095927 | A1* | 4/2011 | Pagnanelli | ............ H03M 3/468 |
| | | | | 341/166 |
| 2015/0280724 | A1 | 10/2015 | Menkhoff et al. | |
| 2017/0353191 | A1* | 12/2017 | Weng | .................... H03M 3/458 |

* cited by examiner

RE-QUANTIZATION DEVICE HAVING NOISE SHAPING FUNCTION, SIGNAL COMPRESSION DEVICE HAVING NOISE SHAPING FUNCTION, AND SIGNAL TRANSMISSION DEVICE HAVING NOISE SHAPING FUNCTION

TECHNICAL FIELD

The present invention relates to a re-quantization device that converts a pulse code modulation (PCM) signal having a high resolution into a PCM signal having a lower resolution, and particularly, to a re-quantization device that performs shaping quantized noise in re-quantization.

The application is based on Japanese Patent Application No. 2017-191237 filed on Sep. 29, 2017 and Japanese Patent Application No. 2018-093145 filed on May 14, 2018, the content of which is incorporated herein by reference.

BACKGROUND ART

In a case where a sound signal or the like is digitalized, a PCM signal is used as a method of expressing a signal. A PCM signal is a sampled one for each sampling period in a time direction and quantized in a value direction. This is a method which is widely used for an intermediate signal in the recording of a signal or signal processing.

In a case of an intermediate signal in signal processing, a PCM signal which is quantized with a sufficiently high resolution is used, but it is necessary to reduce a resolution in a case where a signal is recorded or transmitted. For example, in a case where a signal is stored in a musical compact disc (CD), it is necessary to use a signal quantized to a word length of 16 bits. However, in a music signal or the like, an original signal desired to be recorded has a higher resolution in many cases, and a decrease in a resolution means increase in quantization noise, which leads to a reduction in sound quality.

To solve this problem, a technique for shaping quantized noise has been proposed and actually used. In a case where a sound signal is handled, a frequency band having a high sensitivity of a human hearing and a frequency band having a low sensitivity exist even in an audible band. Consequently, since quantization noise in the frequency band having a high sensitivity is suppressed in exchange for allowing increase in quantization noise in the frequency band having a low sensitivity, it is possible to obtain a signal having higher quality as a whole in terms of audibility. Such a technique is called noise shaping.

However, when noise shaping is performed, there is a problem in that a total amount of quantization noise may be increased. In some cases, quantization noise may be approximately 30 times an rms (root mean square) value. Further, in a case where a PCM signal having been subjected to noise shaping is converted into a PCM signal having the same word length by performing signal processing, quantization noise is added substantially uniformly over all frequencies, and thus an advantage of noise shaping in the previous re-quantization is eliminated, and the increased quantization noise remains as it is. Such a situation occurs in music reproduction in a personal computer. Further, in a case where a sound signal is a PCM signal and is reproduced using a speaker or the like, it is necessary to temporarily convert the sound signal into an analog signal using a digital-analog converter (DAC) or the like, but a similar problem occurs also when additional noise due to the DAC used in this case is not sufficiently small. Since the performance of a DAC to be used is often set for a word length of a PCM signal, the fact is that the performance of a noise-shaped PCM signal is not sufficient in many cases.

Under such circumstances, it is desirable to suppress increase in quantization noise when re-quantization is performed while performing noise shaping.

CITATION LIST

Patent Literature

[Patent Document 1] Japanese Unexamined Patent Application, First Publication No. 2016-213683

SUMMARY OF INVENTION

Technical Problem

An object of the present invention is to provide re-quantization means for performing noise shaping while suppressing increase in a total amount of quantization noise to a certain extent.

Solution to Problem

According to a first aspect of the invention, there is provided a re-quantization device having a noise shaping function, the re-quantization device including a subtractor which is configured to input a high resolution signal being a pulse code modulation signal and outputs a low resolution signal being a pulse code modulation signal to detect re-quantization noise which is a difference between the high resolution signal and the low resolution signal, a discrete time filter which is configured to perform frequency weighting, a quantizer, an adder which is configured to add an additional signal to an output signal of the quantizer, and an additional signal selector which is configured to generate the additional signal, in which the high resolution signal is input to the quantizer, a signal obtained by adding the additional signal to the output signal of the quantizer is set to be the low resolution signal, the re-quantization noise is input to the discrete time filter, the additional signal is calculated on the basis of values of the output signal of the discrete time filter from a present time to a finite step future, the additional signal has 31 or less values, and these processes are executed through batch processing.

According to a second aspect of the invention, there is provided a re-quantization device having a noise shaping function, the re-quantization device including a subtractor which is configured to input a high resolution signal being a pulse code modulation signal and a known noise signal being a pulse code signal and output a signal obtained by synthesizing a low resolution signal being a pulse code modulation signal and the known noise signal to detect re-quantization noise which is a difference between the high resolution signal and a sum of the low resolution signal and the known noise signal, a discrete time filter which is configured to perform frequency weighting, a quantizer, an adder which is configured to add an additional signal to an output signal of the quantizer, and an additional signal selector which is configured to generate the additional signal, in which the high resolution signal is input to the quantizer, a signal obtained by adding the additional signal to the output signal of the quantizer is set to be the low resolution signal, the re-quantization noise is input to the discrete time filter, the additional signal is calculated on the basis of values of the output signal of the discrete time filter from a present time to a finite step future, the additional signal has 31 or less values, and these processes are executed through batch processing.

According to a third aspect of the invention, in the re-quantization device having a noise shaping function according to the first or second aspects of the invention, real-time processing may be executed by delaying the low resolution signal by a finite step and outputting the low resolution signal.

According to a fourth aspect of the invention, in the re-quantization device having a noise shaping function according to any one of the first to third aspects of the invention, the additional signal may have three values.

According to a fifth aspect of the invention, in the re-quantization device having a noise shaping function according to any one of the first to fourth aspects of the invention, a resolution of the low resolution signal may be lower than a resolution of the high resolution signal.

According to a sixth aspect of the invention, there is provided a signal compression device having a noise shaping function, the signal compression device including the re-quantization device having a noise shaping function according to any one of the first to fifth aspects of the invention, the re-quantization device inputting a high resolution signal being a pulse code modulation signal and outputting a low resolution signal being a pulse code modulation signal, and a signal compressor which is configured to convert the low resolution signal into compressed data, in which the high resolution signal is used as an input signal, and the compressed data is used as an output signal.

According to seventh invention of the invention, there is provided a signal transmission device having a noise shaping function, the signal transmission device including the signal compression device according to the sixth aspect of the invention, the signal compression device inputting a high resolution signal being a pulse code modulation signal and outputting compressed data, and a transmitter which is a means for transmitting the compressed data.

Advantageous Effects of Invention

It is possible to realize a re-quantization device that performs noise shaping while suppressing increase in quantization noise by using a technique of the present invention. As a result, it is possible to suppress deterioration of a signal-to-noise ratio under a condition that frequency weighting is not performed.

DESCRIPTION OF EMBODIMENTS

Hereinafter, embodiments of the present invention will be described with reference to the drawings. The present invention is not limited to the following embodiments, and changes, corrections, and improvements can be made without departing from the scope of the invention.

First Embodiment

Figure 1:
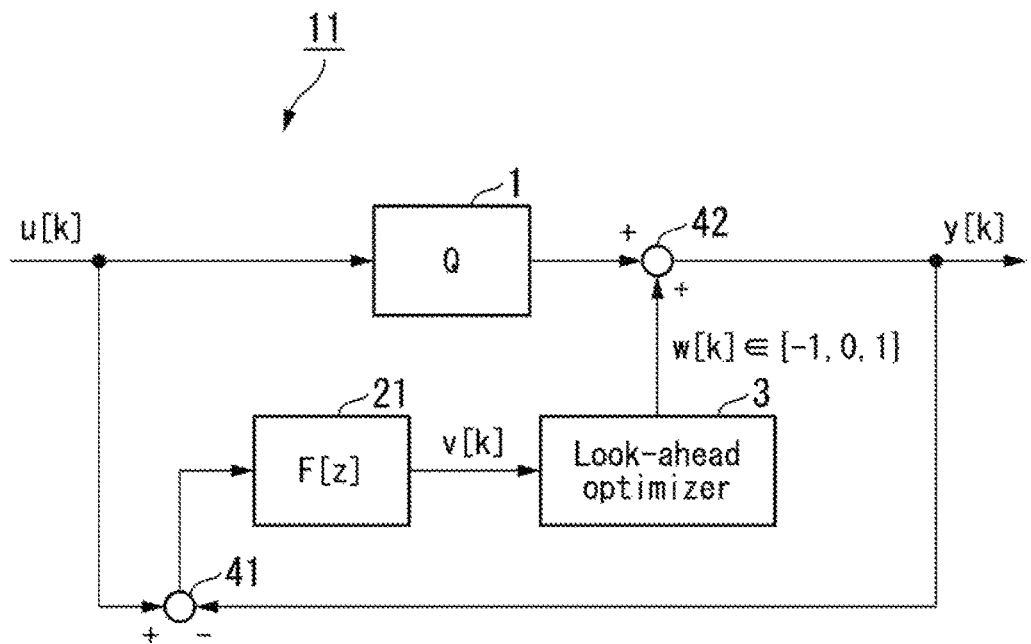
FIG. 1 is a diagram showing a configuration of a re-quantization device having a noise shaping function in a first embodiment of the present invention.

A configuration of a re-quantization device 11 according to a first embodiment of the present invention is shown in FIG. 1. The re-quantization device has a noise shaping function to convert a high resolution PCM signal u[k] into a low resolution PCM signal y[k].

The low resolution PCM signal y[k] is a discrete time signal having a value of an integer. For convenience of description, it is assumed that the value of the high resolution PCM signal u[k] is given in a fixed-point format and has an integer part and a fractional part. In the re-quantization device 11, a resolution is reduced by an amount of the fractional part of the high resolution PCM signal u[k], and thus the low resolution PCM signal y[k] is output. The re-quantization device 11 having a noise shaping function is executed through batch processing instead of real-time processing, and thus causality is not necessarily required in internal processing.

An operation will be described as follows. The high resolution PCM signal u[k] is input to a quantizer 1, and the quantizer 1 outputs a signal obtained by simply rounding a fractional part to an integer. An additional signal w[k] to be described later is added to the signal output from the quantizer 1 by an adder 42, and thus a low resolution signal y[k] is generated and output. On the other hand, a difference between a low resolution signal y[k] and a high resolution signal u[k] is detected as re-quantization noise by a subtractor 41 and is input to a discrete time filter 21. The discrete time filter 21 is a filter that performs frequency weighting for performing shaping of re-quantization noise. A filter output signal v[k] which is an output signal of the discrete time filter 21 is input to an additional signal selector 3. Here, a case where the discrete time filter 21 is strictly proper will be described. That is, it is assumed that the influence of the discrete time filter 21 to an input appears late by one or more steps in an output.

Figure 2:
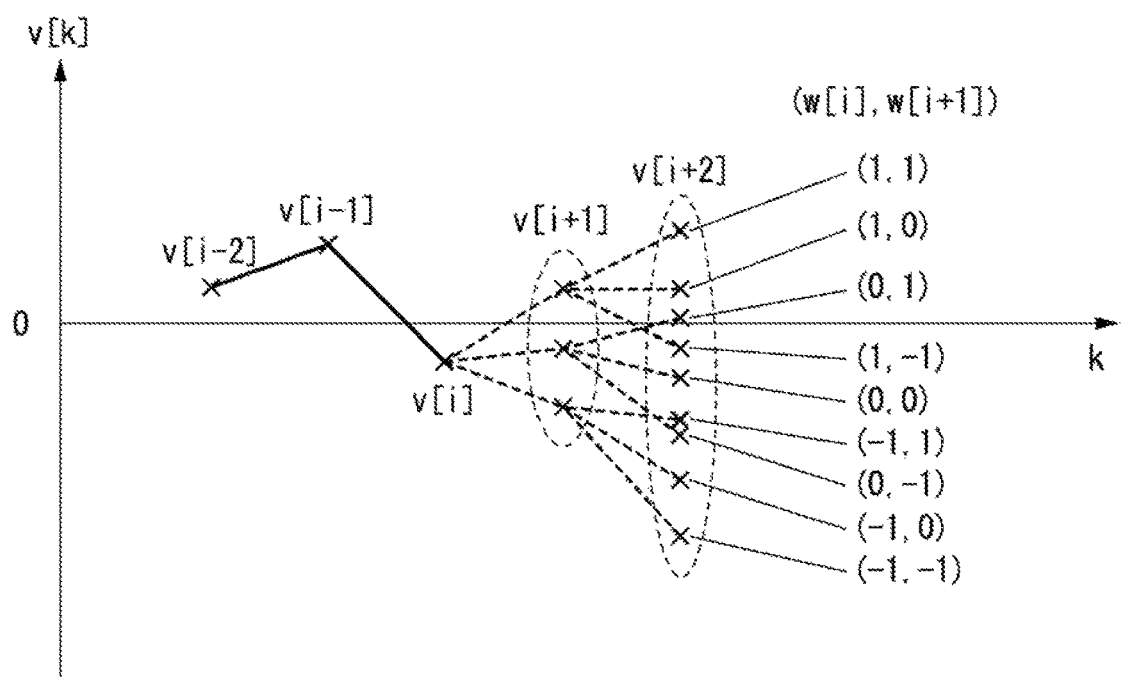
FIG. 2 is a diagram showing states of filter output signals in the re-quantization device having a noise shaping function in the first embodiment.

The additional signal w[k] is a discrete time signal having three values and has values of {−1, 0, 1} when a quantization width of an output signal of the quantizer 1 is set to 1. The additional signal selector 3 calculates combinations of additional signals w[i] to w[i+N−1] for minimizing a square sum of values v[i+1] to v[i+N] of a filter output signal by setting a present time to be k=i when a predicted number of steps is set to be N. Specifically, all possible 3^N (hat N) combinations of the additional signals w[i] to w[i+N−1] for minimizing a square sum of the filter output signals v[i+1] to v[i+N] are searched for. Here, 3^N indicates an Nth power of 3. A state when N=2 is shown in FIG. 2. In this case, (0, 1) is selected as a combination of (w[i], w[i+1]). Since the processing is not performed in real time, that is, batch processing is performed, calculation can be performed using future values of signals.

A signal to be actually used among the obtained additional signals w[i] to w[i+N−1] is w[i] which is an additional signal at the present time, and the value of w[i+1] to be actually used is similarly calculated at the next time k=i+1.

In the first embodiment, combinations of the additional signals w[i] to w[i+N−1] for minimizing a square sum of the filter output signals v[i+1] to v[i+N] are calculated. However, the combinations may not be strictly required to be combinations for minimizing a square sum, and combinations of the additional signals w[i] to w[i+N−1] in which a square sum of the filter output signals v[i+1] to v[i+N] is small may be calculated.

In the first embodiment, combinations of the additional signals w[i] to w[i+N−1] for minimizing a square sum of the filter output signals v[i+1] to v[i+N] are calculated. However, it is not necessary to use a square sum for evaluation, and an absolute value sum of the filter output signals v[i+1] to v[i+N] or a maximum value of absolute values of the filter output signals v[i+1] to v[i+N] may be used. In addition, only an absolute value of the filter output signal v[i+N] may also be used.

In the first embodiment, combinations of the additional signals w[i] to w[i+N−1] are calculated. However, a signal to be actually used is w[i] which is the value of an additional signal at the present time, and thus only w[i] may be directly calculated from the state of the discrete time filter 21 at the present time and output signals of the quantizer 1 from time i to time i+N−1.

In the first embodiment, when combinations of the additional signals w[i] to w[i+N−1] are calculated, all possible 3^N combinations are set as candidates. However, there are combinations which are clearly not selected in a case where the value of N is particularly large, and thus such combinations may be removed from candidates and all possible combinations may not be necessarily set as candidates.

In the first embodiment, additional signals are added to output signals of the quantizer 1. However, additional signals may be added to input signals of the quantizer 1, and it is apparent that an operation is completely the same as in a case where additional signals are added to output signals of the quantizer 1.

In the first embodiment, the additional signal w[k] has three values of {−1, 0, 1}. However, the additional signal w[k] may not have three values, and may have two values of {−1, 1}. In this case, a total amount of quantization noise to be added by the re-quantization device increases. However, the number of possible combinations of the additional signals w[i] to w[i+N−1] is 2^N which is significantly reduced, and thus there is an advantage in that the amount of calculation in the re-quantization device can be reduced. Here, 2^N indicates an Nth power of 2. In addition, the additional signal w[k] may have four or more values and 31 or less values, five values, seven values, or nine values. It is possible to improve the performance of noise shaping by increasing the number of values of the additional signal w[k] depending on the setting of the discrete time filter 21. However, the performance of noise shaping is not improved even when the number of values of the additional signal w[k] is increased more than necessary. When the number of values of the additional signal w[k] increases, a total amount of re-quantization noise increases and becomes closer to a case where a method in the related art is used. However, when a method in the related art is used, there is a probability that an occurrence probability of an instantaneous value of re-quantization noise will have a large value according to an error function. On the other hand, in a case where the present invention is used, there is an advantage in that the range of a value of quantization noise can be set in accordance with the value of the additional signal w[k]. However, even if the additional signal w[k] have 31 or more values, there is no practical advantage.

In the first embodiment, it is assumed that the resolution of a low resolution signal (y[k]) is lower than the resolution of a high resolution signal (u[k]). However, this restriction need not necessarily be observed, and the resolution of the low resolution signal (y[k]) and the resolution of the high resolution signal (u[k]) may be equal to each other. The resolution of a low resolution signal (y[k]) is often determined according to specifications of a subsequent device to be used, specifications of a data format, and the like. On the other hand, regarding the resolution of a high resolution signal (u[k]), the high resolution signal may have various resolutions depending on a signal to be handled. Under such a situation, the resolution of a low resolution signal (y[k]) and the resolution of a high resolution signal (u[k]) may be equal to each other. In such a case, switching whether or not to use the re-quantization device 11 makes processing complex, and thus there is an advantage in that the re-quantization device 11 can be used at all times regardless of the resolution of the high resolution signal (u[k]), and a problem of sound quality deterioration does not appear significantly in practical use.

In order to show the usefulness of the first embodiment, a numerical example is shown. As conditions, a sampling frequency is 44.1 kHz, a word length of a low resolution signal y[k] is 10 bits, and a resolution of a high resolution signal u[k] is sufficiently high. A sine wave having a signal of −0.19 dBfs and a frequency of approximately 17.7 kHz is used.

Figure 3:
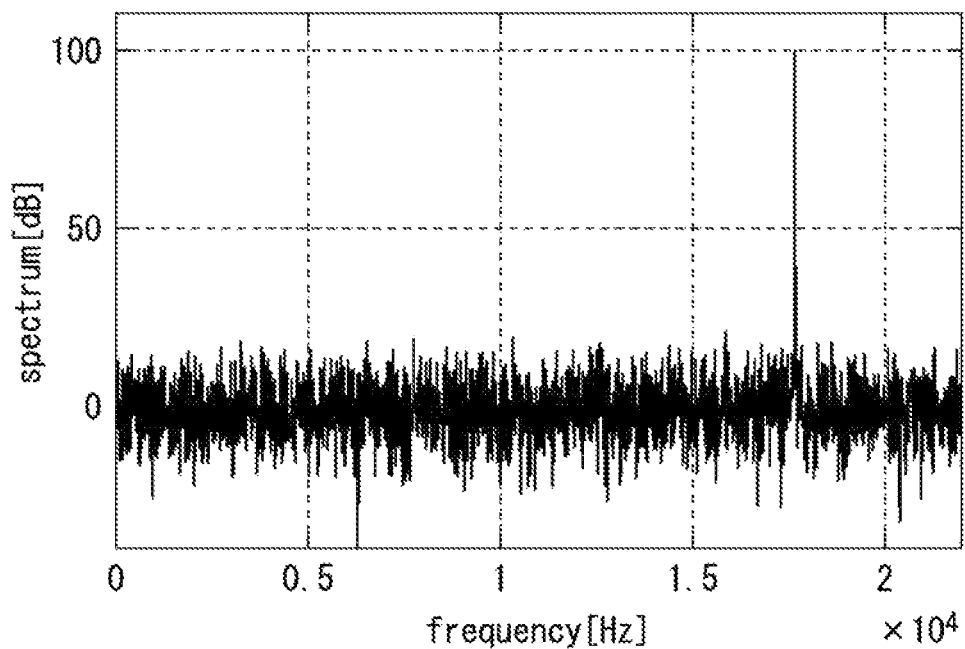
FIG. 3 shows an example of a spectrum of a re-quantized signal in a case where noise shaping is not performed.

FIG. 3 shows a spectrum of a quantized signal when simple noise shaping is not performed. A vertical axis has been adjusted such that a spectrum of quantization noise is in the vicinity of 0 dB. It can be seen that the quantization noise is distributed substantially uniquely. The magnitude of the quantization noise in this case is ⅓ LSB as an rms value in a theoretical value.

Figure 4:
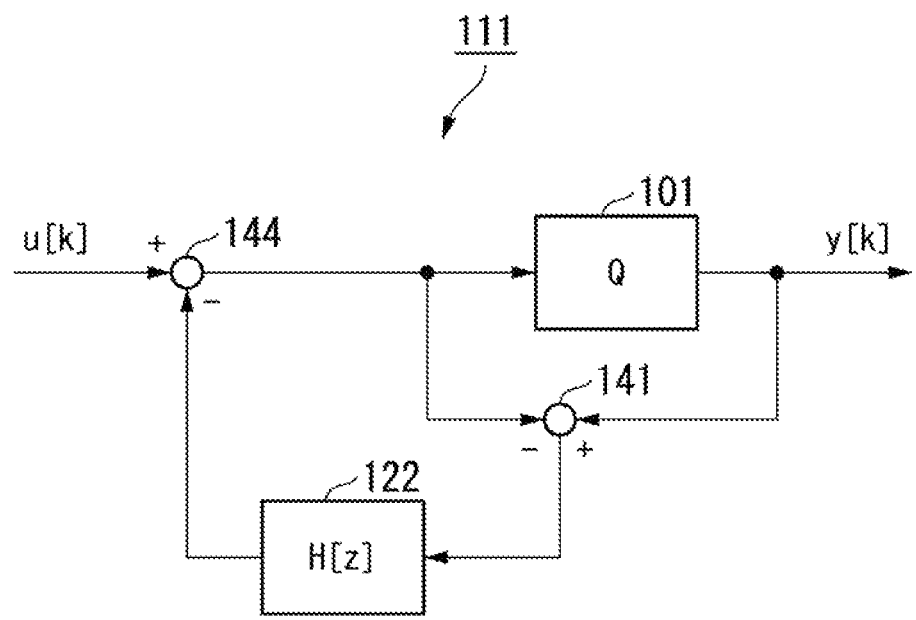
FIG. 4 is a diagram showing a configuration of a re-quantization device having a noise shaping function in the related art.
Figure 6:
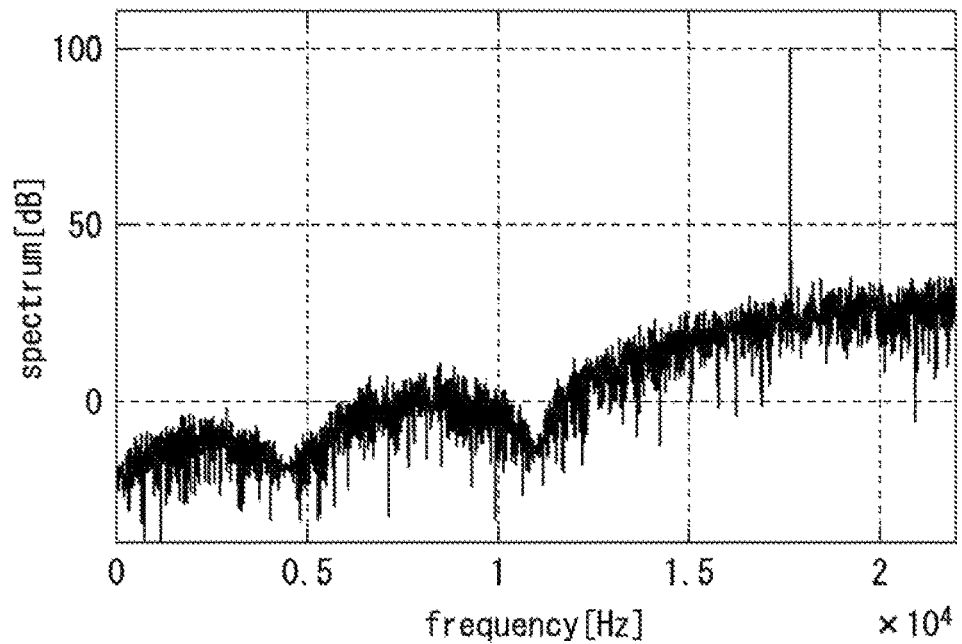
FIG. 6 shows an example of a spectrum of an output signal of the re-quantization device having a noise shaping function in the related art.

Next, an example of a case where noise shaping which is the related art is applied will be described. A configuration of a re-quantization device 111 used is shown in FIG. 4. When a transfer function of a discrete time filter 122 is set to be H[z], it is known that an expected value of a spectrum of re-quantization noise is proportional to a gain response of a frequency response of (1−H[z]). FIG. 6 shows a spectrum of a low resolution signal y[k] when H[z] is set such that a gain response of (1−H[z]) has characteristics shown in FIG.

5. It can be seen that quantization noise increases with a frequency exceeding 12 kHz. The magnitude of the quantization noise in this case was 1.89 LSB as an rms value.

Figure 5:
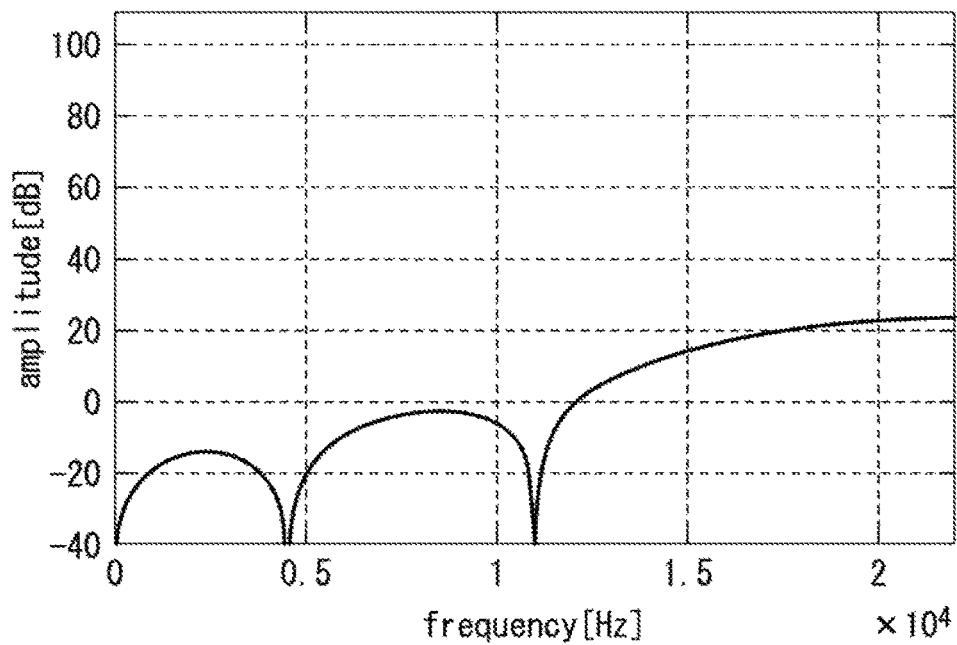
FIG. 5 is a diagram showing a target spectrum shape with respect to re-quantization noise when noise shaping is performed.
Figure 7:
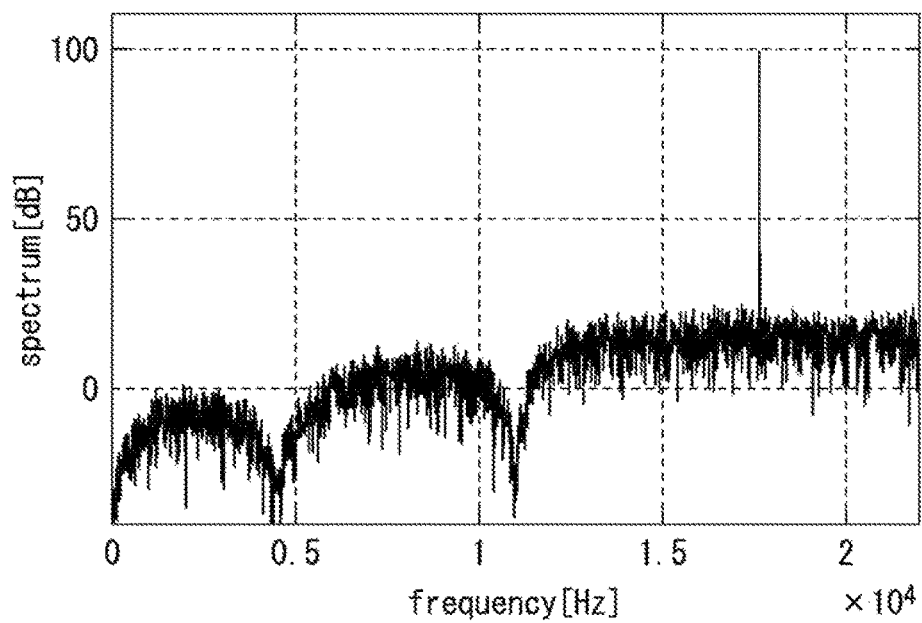
FIG. 7 shows an example of a spectrum of an output signal of the re-quantization device having a noise shaping function in the first embodiment.

Next, a case where the first embodiment is used will be described. When a transfer function of the discrete time filter 21 is set to be F[z], noise shaping is performed such that a filter output signal v[k] which is an output signal of the discrete time filter 21 becomes close to white, and thus an expected value of a spectrum of re-quantization noise becomes close to a form proportional to a gain response of a frequency response of 1/F[z]. However, the number of values of an additional signal w[k] is limited to three, and thus the value thereof actually deviates. In particular, there is a tendency for a spectrum of re-quantization noise to be suppressed in a frequency in which a spectrum density increases and to increase in a frequency region in which a spectrum density is low. FIG. 7 shows a spectrum of re-quantization noise in the first embodiment in a case where the value of N is set to 4 and the discrete time filter 21 is designed such that a gain response of 1/F[z] is as shown in FIG. 5. As compared with a case where a noise shaping technique according to the related art shown in FIG. 4 is used, it can be seen that re-quantization noise is suppressed in a frequency region of 15 kHz or more. An rms value of the re-quantization noise in this case is 0.72 LSB, which has been significantly reduced to 0.38 times that in the case where the technique according to the related art is used.

Figure 8:
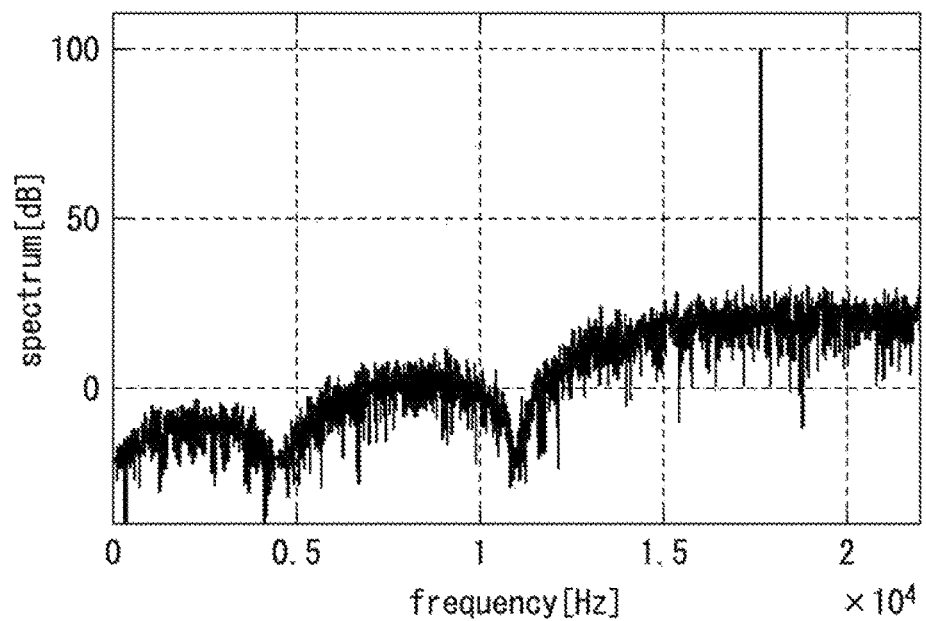
FIG. 8 shows an example of a spectrum of an output signal in a case where there are five values to be taken by an additional signal w[k] for the re-quantization device having a noise shaping function in the first embodiment.

FIG. 8 shows a spectrum of re-quantization noise when an additional signal w[k] has five values of {−2, −1, 0, 1, 2} and the other settings are the same as those in the first embodiment. Although a high-frequency region spectrum has increased as compared with the case in the first embodiment, it can be seen that a low-frequency region spectrum is more suppressed.

Figure 9:
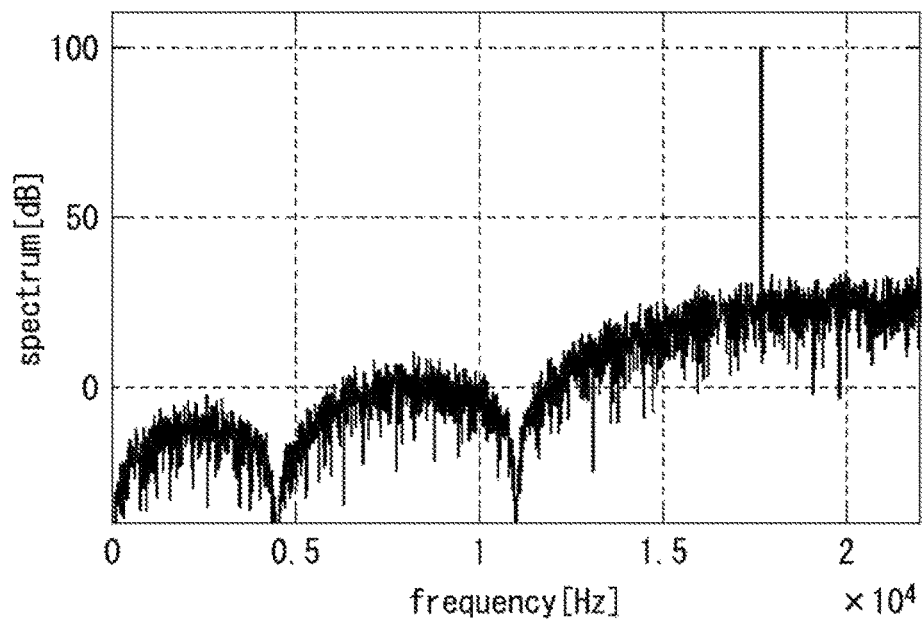
FIG. 9 shows an example of a spectrum of an output signal in a case where there are nine values to be taken by an additional signal w[k] for the re-quantization device having a noise shaping function in the first embodiment.

FIG. 9 shows a spectrum of re-quantization noise when an additional signal w[k] has nine values of {−4, −3, −2, −1, 0, 1, 2, 3, 4} and the other settings are the same as those in the first embodiment. A low-region spectrum is slightly suppressed as compared with the case where an additional signal has five values and a high-region spectrum has increased. In this case, it is not much advantageous to the case where an additional signal has five values. It is necessary to determine the number of values of the additional signal w[k] in consideration of desired noise shaping performance, the magnitude of re-quantization noise, and required computation resources.

As described above, the first embodiment provides the re-quantization device 11 having a noise shaping function. The re-quantization device includes the subtractor 41 which is a means for inputting a high resolution signal u[k] being a pulse code modulation signal and outputting a low resolution signal y[k] being a pulse code modulation signal to detect re-quantization noise which is a difference between the high resolution signal u[k] and the low resolution signal y[k], the discrete time filter 21 that performs frequency weighting, the quantizer 1, the adder 42 which is a means for adding an additional signal w[k] to an output signal of the quantizer 1, and the additional signal selector 3 which is a means for generating the additional signal w[k]. The high resolution signal u[k] is input to the quantizer 1, a signal obtained by adding the additional signal w[k] to the output signal of the quantizer 1 is set to be the low resolution signal y[k], the re-quantization noise is input to the discrete time filter 21, the additional signal w[k] is calculated on the basis of values of the output signal of the discrete time filter 21 from a present time to a finite step future, the additional signal w[k] have 31 or less values, and these processes are executed through batch processing.

Further, according to the first embodiment, in the re-quantization device 11 having a noise shaping function according to the previous paragraph, the additional signal w[k] has three values.

Further, according to the first embodiment, in the re-quantization device 11 having a noise shaping function according to the previous paragraph, a resolution of the low resolution signal y[k] is lower than a resolution of the high resolution signal u[k].

Second Embodiment

Figure 10:
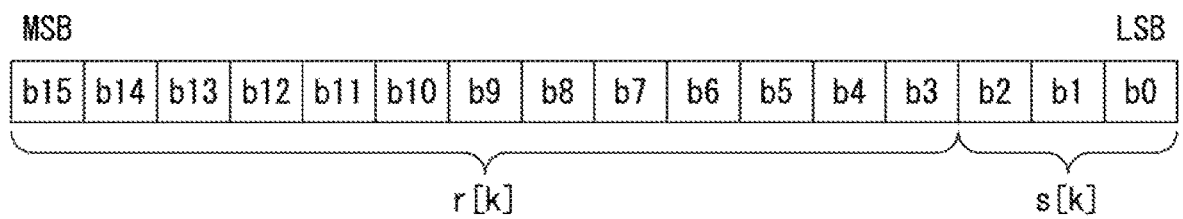
FIG. 10 is a diagram showing an example of a bit configuration of an output signal of a re-quantization device having a noise shaping function in a second embodiment of the present invention.

A second embodiment of the present invention relates to a re-quantization device having a noise shaping function in a case where a low resolution signal y[k] which is an output signal of the re-quantization device includes bits which are not directly related to a high resolution signal u[k] which is an input signal of the re-quantization device. FIG. 10 shows an example of a bit configuration of a low resolution signal y[k]. The low resolution signal y[k] is a binary 16-bit signal based on a complement of 2. However, a known noise signal s[k] being data of low-order 3 bits is data not directly related to a high resolution signal u[k], and a part r[k] of high-order 13 bits is directly related to the high resolution signal u[k]. A technique for making the influence of a known noise signal s[k] appear as only re-quantization noise even when 16-bit data of y[k] is reproduced as it is by performing noise shaping in consideration of the value of the known noise signal s[k] in generating r[k] is already known. According to this technique, new data can be incorporated into existing sound data such as in a CD. The second embodiment is an embodiment in which this technique is applied to the first embodiment.

Figure 11:
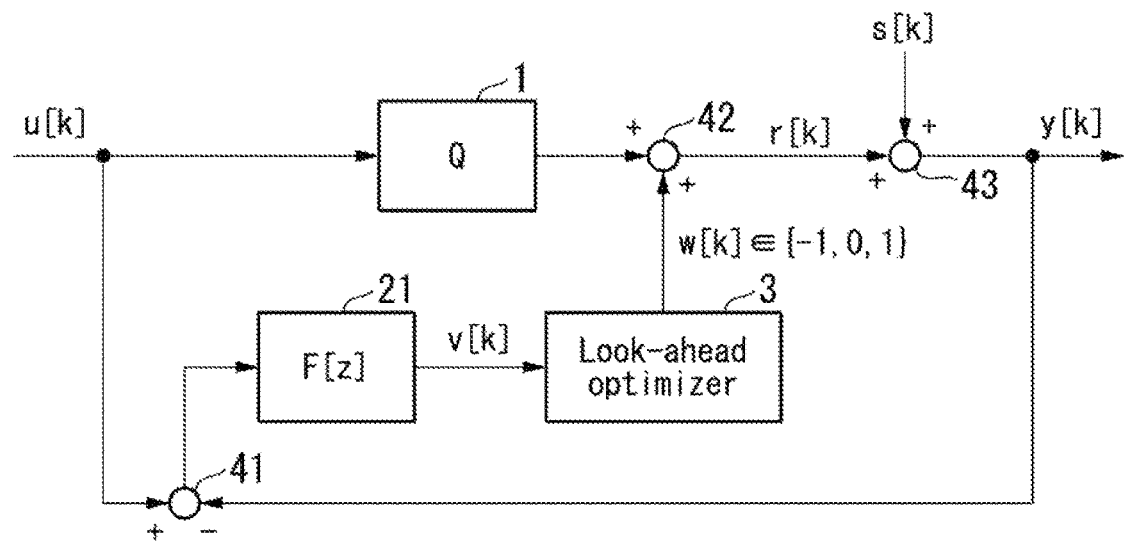
FIG. 11 is a diagram showing a configuration of the re-quantization device having a noise shaping function in the second embodiment.

FIG. 11 shows a configuration of a re-quantization device 11 having a noise shaping function according to the second embodiment. A difference in components from the first embodiment is that a known noise signal s[k] is added to an output signal of an adder 42 by an adder 43. When 16-bit data of a low resolution signal y[k] is handled as a PCM signal as it is, the known noise signal s[k] becomes a simple noise component, and a future value of the known noise signal s[k] is required when an additional signal w[k] is calculated.

In a bit configuration (FIG. 10) of the low resolution signal y[k], it is assumed that b3 is at ones place, r[k] has a value of an integer, and the known noise signal s[k] has a value of equal to or greater than −½ and less than ½ and is expressed as a binary number based on a complement of 2 in a coded fixed decimal point format. The known noise signal is handled as a coded number to suppress a maximum value of an absolute value of the known noise signal s[k] and to suppress an absolute value of an average value of the known noise signal s[k]. Addition of a signal by the adder 43 is executed as addition of coded binary numbers having different word lengths but having a two's complement format. In the quantizer 1, a signal is rounded to the place of b3, and the additional signal w[k] has any one value of {−1, 0, 1} with b3 as the place of 1.

As an operation, re-quantization noise is detected for a signal including the known noise signal s[k], and thus noise shaping is performed in such a manner as to cancel the known noise signal s[k]. The other configurations are the same as those in the first embodiment.

In the second embodiment, a bit configuration of a low resolution signal y[k] is set as shown in FIG. 10. However, this is not limiting, and a bit configuration of a low resolution signal y[k] may be any configuration other than that shown in FIG. 10.

As described above, the second embodiment provides the re-quantization device 11 having a noise shaping function. The re-quantization device includes a subtractor 41 which is a means for inputting a high resolution signal u[k] being a pulse code modulation signal and a known noise signal (s[k]) being a pulse code signal and outputting a signal obtained by synthesizing a low resolution signal y[k] being a pulse code modulation signal having a resolution lower than that of the high resolution signal u[k] and the known noise signal (s[k]) to detect re-quantization noise which is a difference between the high resolution signal u[k] and a sum of the low resolution signal y[k] and the known noise signal, a discrete time filter 21 that performs frequency weighting, the quantizer 1, the adder 42 which is a means for adding an additional signal w[k] to an output signal of the quantizer 1, and an additional signal selector 3 which is a means for generating the additional signal w[k]. The high resolution signal u[k] is input to the quantizer 1, a signal obtained by adding the additional signal w[k] to the output signal of the quantizer 1 is set to be the low resolution signal y[k], the re-quantization noise is input to the discrete time filter 21, the additional signal w[k] is calculated on the basis of values of the output signal of the discrete time filter 21 from a present time to a finite step future, the additional signal w[k] has three or less values, and these processes are executed through batch processing.

Third Embodiment

In a third embodiment of the present invention, the re-quantization device 11 having a noise shaping function executed through batch processing in the first embodiment is executed by real-time processing.

In the re-quantization device having a noise shaping function in the first embodiment, when a present time is set to be k=i, values of filter output signals v[i+1] to v[i+N] are used in obtaining the value w[i] of an additional signal at the present time, which means that values of high resolution signals u[i] to u[i+N] which are input signals of the re-quantization device are required. Here, when a low resolution signal y[k] which is an output signal of the re-quantization device is delayed by N steps or more, it is apparent that the same signal processing as that in the first embodiment can be executed in real time.

In the third embodiment of the present invention, the processing in the first embodiment is executed in real time, but the processing in the second embodiment may be executed in real time. However, since it may take time to determine the value of a known noise signal s[k], it should be noted that it may be necessary to delay a low resolution signal y[k] to that extent.

As described above, according to the third embodiment, in the re-quantization device 11 having a noise shaping function according to the first embodiment or the second embodiment, real-time processing is executed by delaying a low resolution signal y[k] by a finite step and outputting the low resolution signal.

Fourth Embodiment

Figure 12:
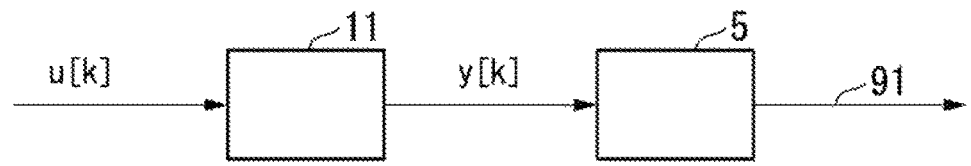
FIG. 12 is a configuration example of a signal compression device having a noise shaping function in a fourth embodiment.

FIG. 12 shows a configuration of a signal compression device 12 having a noise shaping function according to a fourth embodiment of the present invention, in which a high resolution PCM signal u[k] is used as an input.

The high resolution PCM signal u[k] is converted into a low resolution signal y[k] by the re-quantization device 11 according to the first embodiment of the present invention. A resolution of the low resolution signal y[k] is 16 bits. The low resolution signal y[k] is input to a signal compressor 5 and converted into compressed data 91. A signal compression method in the signal compressor 5 may be lossless compression or lossy compression such as of MP3 or AAC. In the case of lossless compression, the magnitude of re-quantization noise is suppressed in the low resolution signal y[k] obtained by the re-quantization device 11 according to the first embodiment, and thus the amount of information of quantization noise is decreased to that extent, thereby allowing a compression ratio of a signal in the signal compressor 5 to be improved. Further, in the case of lossy compression, a spectrum of re-quantization noise is suppressed in the low resolution signal y[k] obtained by the re-quantization device 11 according to the first embodiment, and thus it is possible to obtain high-quality compressed data 91 by the signal compressor 5 to that extent.

Since many standardized compression algorithms are used in the signal compressor 5, a resolution of a low resolution signal y[k] which is an input signal of the signal compressor 5 is often fixed, but a high resolution PCM signal u[k] which is a sound source signal has various resolutions. Therefore, a resolution of the high resolution PCM signal u[k] and a resolution of the low resolution signal y[k] may be the same. In such a case, the re-quantization device 11 may not be bypassed. Noticeable deterioration in sound quality does not occur even through the re-quantization device 11, and there is an advantage that simplification of the device is expected by omitting the control of a signal path.

The fourth embodiment can be used to generate compressed sound data for the purpose of music distribution and generate sound data of a video signal with a sound stored in a DVD or a Blu-ray disc. In addition, the fourth embodiment can also be used for a device that records a signal including compressed sound data by an individual. However, the use of the fourth embodiment is not limited thereto.

In the fourth embodiment, the re-quantization device 11 uses batch processing according to the first embodiment of the present invention, but the re-quantization device 11 may not perform batch processing or may use real-time processing according to the third embodiment of the present invention.

As described above, the fourth embodiment provides a signal compression device (12) having a noise shaping function. The signal compression device includes a re-quantization device (11) having a noise shaping function according to a first aspect of the invention and a signal compressor (5). The re-quantization device inputs a high resolution signal (u[k]) which is a pulse code modulation signal and outputs a low resolution signal (y[k]) which is a pulse code modulation signal. The signal compressor converts the low resolution signal (y[k]) into compressed data (91). The high resolution signal (u[k]) is used as an input signal, and the compressed data (91) is used as an output signal.

Fifth Embodiment

Figure 13:
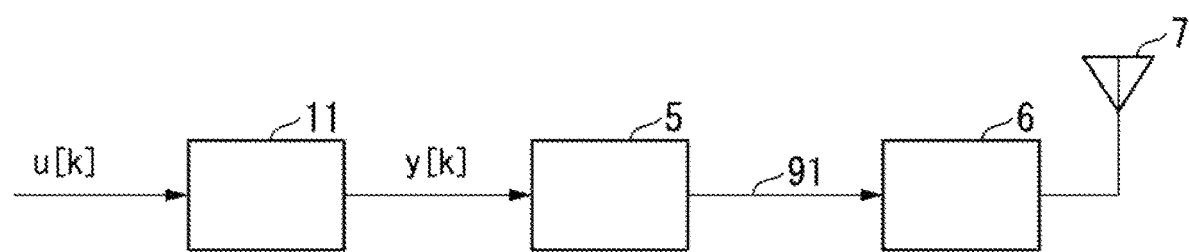
FIG. 13 is a configuration example of a signal transmission device having a noise shaping function in a fifth embodiment.

FIG. 13 shows a configuration of a signal transmission device 13 having a noise shaping function according to a fifth embodiment of the present invention, in which a high resolution PCM signal u[k] is used as an input.

The high resolution PCM signal u[k] is converted into a low resolution signal y[k] by the re-quantization device 11 according to the third embodiment of the present invention. A resolution of the low resolution signal y[k] is 16 bits. The low resolution signal y[k] is input to a signal compressor 5 and converted into compressed data 91. A signal compression method in the signal compressor 5 may be lossless compression or lossy compression such as of MP3 or AAC. In the case of lossless compression, the magnitude of re-quantization noise is suppressed in the low resolution signal y[k] obtained by the re-quantization device 11 according to the third embodiment, and thus the amount of information of quantization noise is decreased to that extent, thereby allowing a compression ratio of a signal in the signal compressor 5 to be improved. Further, in the case of lossy compression, a spectrum of re-quantization noise is suppressed in the low resolution signal y[k] obtained by the re-quantization device 11 according to the third embodiment, and thus it is possible to obtain high-quality compressed data 91 by the signal compressor 5 to that extent. The compressed data 91 obtained by the signal compressor 5 is transmitted by a transmitter 6 and an antenna 7 which are digital signal transmission means.

A transmitted signal is received by a normal compressed data reception device, and a sound is reproduced by reproduction means. This process includes a process of restoring the original data from the compressed data 91 compressed by the signal compressor 5. However, in a case where lossy compression is performed in the signal compressor 5, complete restoration cannot be performed. In this case, it should be noted that a signal can be reproduced on the reception side irrespective of whether or not the re-quantization device 11 functions in the signal transmission device 13. In a case where the re-quantization device 11 functions in the signal transmission device 13, the quality of a sound which is reproduced is increased.

The fifth embodiment can be used in a wireless speaker, a wireless headphone, or the like having an uncompressed sound source as an input. When a sound signal is transmitted in a wireless manner such as Bluetooth (registered trademark), the sound signal is subjected to lossy compression from a relation of a usable signal band and is then wirelessly transmitted in most cases. However, the use of the fifth embodiment is not limited thereto.

In the fifth embodiment, the compressed data 91 is transmitted in a wireless manner, but transmission means may not be wireless or may be wired.

As described above, the fifth embodiment provides a signal transmission device (13) having a noise shaping function. The signal transmission device includes a signal compression device (12) according to a third aspect of the invention and a transmitter (6). The signal compression device inputs a high resolution signal (u[k]) which is a pulse code modulation signal and outputs compressed data (91). The transmitter is a means for transmitting the compressed data (91).

As described above, it is possible to realize the re-quantization device 11 that performs noise shaping while suppressing increase in quantization noise by using the first embodiment, the second embodiment, and the third embodiment. As a result, it is possible to suppress deterioration of a signal-to-noise ratio in a condition that frequency weighting is not performed.

In addition, it is possible to create compressed data 91 having higher quality with respect to a sound signal by using the fourth embodiment.

In addition, by using the fifth embodiment, it is possible to realize the signal transmission device 13 capable of reproducing a sound having higher quality also in a case where compressed data of a sound is transmitted.

INDUSTRIAL APPLICABILITY

It is possible to realize a re-quantization device that performs noise shaping while suppressing increase in quantization noise by using the technique of the present invention. As a result, it is possible to suppress deterioration of a signal-to-noise ratio in a condition that frequency weighting is not performed.

Meanwhile, the inventions described in the above-described embodiments are arranged and disclosed as appendixes.

Appendix 1

According to a first aspect of the invention, there is provided a re-quantization device (11) having a noise shaping function, the re-quantization device including means (41) for inputting a high resolution signal (u[k]) being a pulse code modulation signal and outputting a low resolution signal (y[k]) being a pulse code modulation signal to detect re-quantization noise which is a difference between the high resolution signal (u[k]) and the low resolution signal (y[k]), a discrete time filter (21) which performs frequency weighting, a quantizer (1), means (42) for adding an additional signal (w[k]) to an output signal of the quantizer (1), and means (3) for generating the additional signal (w[k]), in which the high resolution signal (u[k]) is input to the quantizer (1), a signal obtained by adding the additional signal (w[k]) to the output signal of the quantizer (1) is set to be the low resolution signal (y[k]), the re-quantization noise is input to the discrete time filter (21), the additional signal (w[k]) is calculated on the basis of values of the output signal of the discrete time filter (21) from a present time to a finite step future, the additional signal (w[k]) has 31 or less values, and these processes are executed through batch processing.

Appendix 2

According to a second aspect of the invention, there is provided a re-quantization device (11) having a noise shaping function, the re-quantization device including means (41) for inputting a high resolution signal (u[k]) being a pulse code modulation signal and a known noise signal (s[k]) being a pulse code signal and outputting a signal obtained by synthesizing a low resolution signal (y[k]) being a pulse code modulation signal and the known noise signal (s[k]) to detect re-quantization noise which is a difference between the high resolution signal (u[k]) and a sum of the low resolution signal (y[k]) and the known noise signal, a discrete time filter (21) which performs frequency weighting, a quantizer (1), means (42) for adding an additional signal (w[k]) to an output signal of the quantizer (1), and means for generating the additional signal (w[k]), in which the high resolution signal (u[k]) is input to the quantizer (1), a signal obtained by adding the additional signal (w[k]) to the output signal of the quantizer (1) is set to be the low resolution signal (y[k]), the re-quantization noise is input to the discrete time filter (21), the additional signal (w[k]) is calculated on the basis of values of the output signal of the discrete time filter (21) from a present time to a finite step future, the additional signal (w[k]) has 31 or less values, and these processes are executed through batch processing.

Appendix 3

According to a third aspect of the invention, in the re-quantization device (11) having a noise shaping function according to the first or second aspect of the invention, real-time processing is executed by delaying the low resolution signal (y[k]) by a finite step and outputting the low resolution signal.

Appendix 4

According to a fourth aspect of the invention, in the re-quantization device (11) having a noise shaping function according to any one of the first to third aspects of the invention, the additional signal (w[k]) has three values.

Appendix 5

According to a fifth aspect of the invention, in the re-quantization device (11) having a noise shaping function according to any one of the first to fourth aspects of the invention, a resolution of the low resolution signal (y[k]) is lower than a resolution of the high resolution signal (u[k]).

Appendix 6

According to a sixth aspect of the invention, there is provided a signal compression device (12) having a noise shaping function, the signal compression device including the re-quantization device (11) having a noise shaping function according to any one of the first to the fifth aspect of the invention, the re-quantization device inputting a high resolution signal (u[k]) being a pulse code modulation signal and outputting a low resolution signal (y[k]) being a pulse code modulation signal, and a signal compressor (5) which is configured to convert the low resolution signal (y[k]) into compressed data (91), in which the high resolution signal (u[k]) is used as an input signal, and the compressed data (91) is used as an output signal.

Appendix 7

According to a seventh invention of the invention, there is provided a signal transmission device (13) having a noise shaping function, the signal transmission device including the signal compression device (12) according to the sixth aspect of the invention, the signal compression device inputting a high resolution signal (u[k]) being a pulse code modulation signal and outputting compressed data (91), and a transmitter (6) which is a means for transmitting the compressed data (91).

REFERENCE SIGNS LIST 11, 111 Re-quantization device
1, 101 Quantizer
12 Signal compression device
13 Signal transmission device
21, 122 Discrete time filter
3 Additional signal selector
41, 141, 144 Subtractor
42, 43 Adder
5 Signal compressor
6 Transmitter
7 Antenna
91 Compressed data
u[k] High resolution signal
y[k] Low resolution signal
v[k] Filter output signal
w[k] Additional signal
s[k] Known noise signal

What is claimed is:

1. A re-quantization device having a noise shaping function, the re-quantization device comprising:
a subtractor which is configured to input a high resolution signal being a pulse code modulation signal and output a low resolution signal being a pulse code modulation signal to detect re-quantization noise which is a difference between the high resolution signal and the low resolution signal;
a discrete time filter which is configured to perform frequency weighting;
a quantizer;
an adder which is configured to add an additional signal to an output signal of the quantizer; and
an additional signal selector which is configured to generate the additional signal,
wherein the high resolution signal is input to the quantizer,
a signal obtained by adding the additional signal to the output signal of the quantizer is set to be the low resolution signal,
the re-quantization noise is input to the discrete time filter,
the additional signal is calculated on the basis of values of the output signal of the discrete time filter from a present time to a finite step future,
the additional signal has 31 or less values, and
these processes are executed through batch processing.

2. The re-quantization device having a noise shaping function according to claim 1, wherein real-time processing is executed by delaying the low resolution signal by a finite step and outputting the low resolution signal.

3. The re-quantization device having a noise shaping function according to claim 2, wherein the additional signal has three values.

4. The re-quantization device having a noise shaping function according to claim 2, wherein a resolution of the low resolution signal is lower than a resolution of the high resolution signal.

5. A signal compression device having a noise shaping function, the signal compression device comprising:
the re-quantization device having a noise shaping function according to claim 2, the re-quantization device inputting a high resolution signal being a pulse code modulation signal and outputting a low resolution signal being a pulse code modulation signal; and
a signal compressor which is configured to convert the low resolution signal into compressed data,
wherein the high resolution signal is used as an input signal, and the compressed data is used as an output signal.

6. A signal transmission device having a noise shaping function, the signal transmission device comprising:
the signal compression device according to claim 5, the signal compression device inputting a high resolution signal being a pulse code modulation signal and outputting compressed data; and
a transmitter which is a means for transmitting the compressed data.

7. The re-quantization device having a noise shaping function according to claim 1, wherein the additional signal has three values.

8. The re-quantization device having a noise shaping function according to claim 1, wherein a resolution of the low resolution signal is lower than a resolution of the high resolution signal.

9. A signal compression device having a noise shaping function, the signal compression device comprising:
   the re-quantization device having a noise shaping function according to claim 1, the re-quantization device inputting a high resolution signal being a pulse code modulation signal and outputting a low resolution signal being a pulse code modulation signal; and
   a signal compressor which is configured to convert the low resolution signal into compressed data,
   wherein the high resolution signal is used as an input signal, and the compressed data is used as an output signal.

10. A signal transmission device having a noise shaping function, the signal transmission device comprising:
    the signal compression device according to claim 9, the signal compression device inputting a high resolution signal being a pulse code modulation signal and outputting compressed data; and
       a transmitter which is a means for transmitting the compressed data.

11. A re-quantization device having a noise shaping function, the re-quantization device comprising:
    a subtractor which is configured to input a high resolution signal being a pulse code modulation signal and a known noise signal being a pulse code signal and outputs a signal obtained by synthesizing a low resolution signal being a pulse code modulation signal and the known noise signal to detect re-quantization noise which is a difference between the high resolution signal and a sum of the low resolution signal and the known noise signal;
    a discrete time filter which is configured to perform frequency weighting;
    a quantizer;
    an adder which is configured to add an additional signal to an output signal of the quantizer; and
    an additional signal selector which is configured to generate the additional signal,
    wherein the high resolution signal is input to the quantizer,
    a signal obtained by adding the additional signal to the output signal of the quantizer is set to be the low resolution signal,
    the re-quantization noise is input to the discrete time filter,
    the additional signal is calculated on the basis of values of the output signal of the discrete time filter from a present time to a finite step future,
    the additional signal has 31 or less values, and
    these processes are executed through batch processing.

12. The re-quantization device having a noise shaping function according to claim 11 wherein the additional signal has three values.

13. The re-quantization device having a noise shaping function according to claim 11, wherein a resolution of the low resolution signal is lower than a resolution of the high resolution signal.

14. A signal compression device having a noise shaping function, the signal compression device comprising:
    the re-quantization device having a noise shaping function according to claim 11, the re-quantization device inputting a high resolution signal being a pulse code modulation signal and outputting a low resolution signal being a pulse code modulation signal; and
    a signal compressor which is configured to convert the low resolution signal into compressed data,
    wherein the high resolution signal is used as an input signal, and the compressed data is used as an output signal.

* * * * *